(12) United States Patent
Kuhn et al.

(10) Patent No.: US 9,200,762 B2
(45) Date of Patent: Dec. 1, 2015

(54) MIXED LIGHT SOURCE

(75) Inventors: Gerhard Kuhn, Koefering (DE); Ales Markytan, Regensburg (DE); Christian Gaertner, Regensburg (DE); Manfred Scheubeck, Horgau (DE); Horst Varga, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/117,294

(22) PCT Filed: May 4, 2012

(86) PCT No.: PCT/EP2012/058302
§ 371 (c)(1),
(2), (4) Date: Jan. 31, 2014

(87) PCT Pub. No.: WO2012/156217
PCT Pub. Date: Nov. 22, 2012

(65) Prior Publication Data
US 2014/0226324 A1    Aug. 14, 2014

(30) Foreign Application Priority Data
May 16, 2011  (DE) .................. 10 2011 101 645

(51) Int. Cl.
*F21K 99/00*  (2010.01)
*H01L 25/075*  (2006.01)
*H01L 33/64*  (2010.01)
*H01L 23/00*  (2006.01)

(52) U.S. Cl.
CPC . *F21K 9/50* (2013.01); *H01L 24/32* (2013.01); *H01L 25/0753* (2013.01); *H01L 33/641* (2013.01); *H01L 33/645* (2013.01); *H01L 2924/0002* (2013.01)

(58) Field of Classification Search
CPC ...... H01L 25/0753; H01L 31/024; F21K 9/00
See application file for complete search history.

(56) References Cited

U.S. PATENT DOCUMENTS

| 7,345,320 B2 * | 3/2008 | Dahm ............................. 257/99 |
| 2006/0261351 A1 | 11/2006 | Nakazato et al. |
| 2007/0145403 A1 | 6/2007 | Tomioka et al. |
| 2007/0147044 A1 | 6/2007 | Takenaka |
| 2008/0128718 A1 | 6/2008 | Sumitani |
| 2008/0150126 A1 * | 6/2008 | Zhou et al. .................... 257/712 |

(Continued)

FOREIGN PATENT DOCUMENTS

| CN | 1845316 A | 10/2006 |
| CN | 1992362 A | 7/2007 |

(Continued)

*Primary Examiner* — Duy T Nguyen
*Assistant Examiner* — Mounir Amer
(74) *Attorney, Agent, or Firm* — Slater & Matsil, L.L.P.

(57) ABSTRACT

A mixed light source has a first semiconductor component, which is provided for generating a first radiation fraction, and a second semiconductor component, which is provided for generating radiation of a second radiation fraction different from the first radiation fraction. The first semiconductor component is mounted by a first mounting point on a first heat sink with a first thermal resistance R1. The second semiconductor component is mounted by a second mounting point on a second heat sink with a second thermal resistance R2. The thermal resistances R1 and R2 are different from one another.

18 Claims, 3 Drawing Sheets

(56) References Cited

U.S. PATENT DOCUMENTS

| | | |
|---|---|---|
| 2009/0016072 A1* | 1/2009 | Lee et al. .................. 362/373 |
| 2009/0059582 A1 | 3/2009 | Kulkarni |
| 2009/0160344 A1 | 6/2009 | Hsu et al. |
| 2009/0161354 A1 | 6/2009 | Hsu et al. |
| 2010/0276706 A1* | 11/2010 | Herrmann .................. 257/89 |
| 2010/0277901 A1* | 11/2010 | Farchtchian et al. ......... 362/227 |
| 2011/0114976 A1* | 5/2011 | Hochstein .................. 257/91 |

FOREIGN PATENT DOCUMENTS

| | | |
|---|---|---|
| CN | 101463985 A | 6/2009 |
| EP | 2072886 A2 | 6/2009 |

* cited by examiner

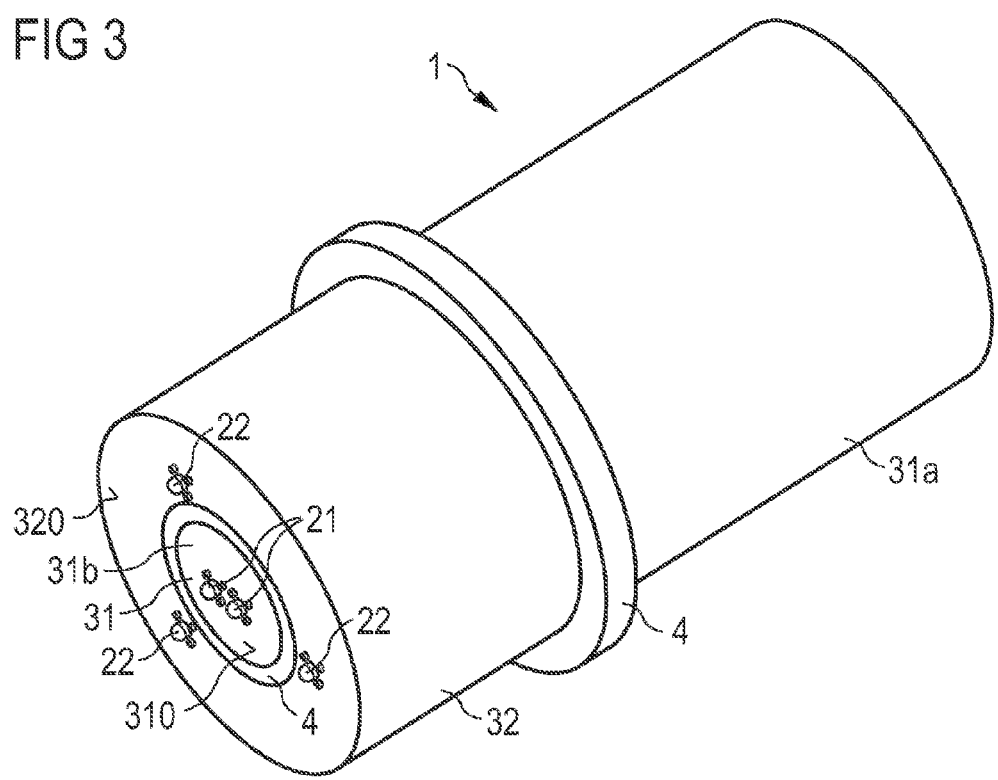

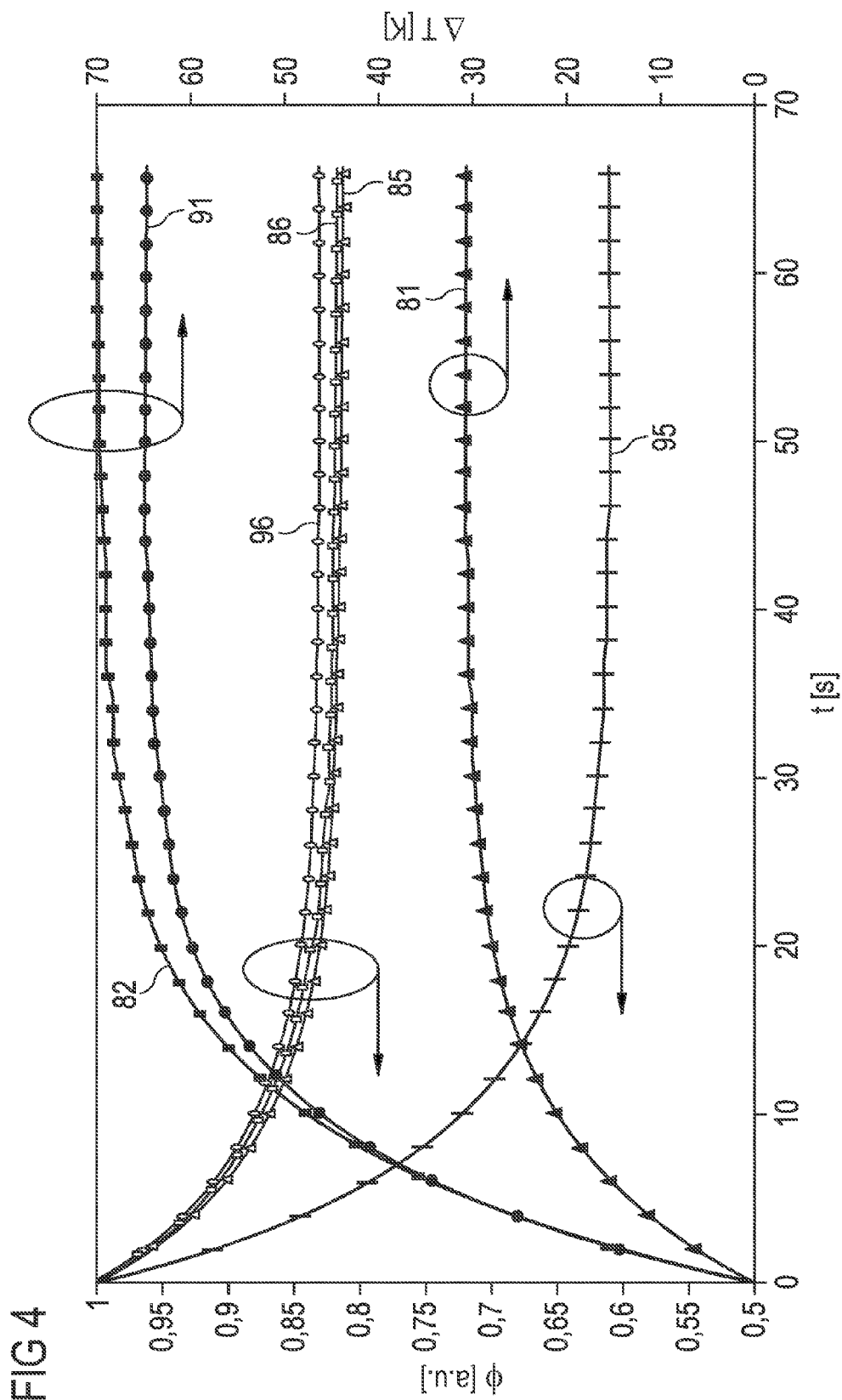

MIXED LIGHT SOURCE

This patent application is a national phase filing under section 371 of PCT/EP2012/058302, filed May 4, 2012, which claims the priority of German patent application 10 2011 101 645.0, filed May 16, 2011, each of which is incorporated herein by reference in its entirety.

TECHNICAL FIELD

The present patent application relates to a mixed light source with a first semiconductor component and a second semiconductor component.

BACKGROUND

In mixed light sources with semiconductor components, semiconductor components based on different compound semiconductor materials may be used to generate radiation in different spectral ranges. Different degrees of temperature dependency of the emitted radiant power for different semiconductor components may lead to a shift in the color locus of the radiation emitted overall by the mixed light source.

SUMMARY OF THE INVENTION

Embodiments of the invention provide a mixed light source in which color locus dependency, in particular with regard to a temperature change of the semiconductor components, is simply reduced.

According to one embodiment, a mixed light source comprises a first semiconductor component, which is provided for generating a first radiation fraction and a second semiconductor component, which is provided for generating radiation of a second radiation fraction different from the first radiation fraction. The first semiconductor component is mounted by means of a first mounting point on a first heat sink with a first thermal resistance R1. The second semiconductor component is mounted by means of a second mounting point on a second heat sink with a second thermal resistance R2. The thermal resistances R1 and R2 differ from one another. The second thermal resistance R2 is preferably at least 20% greater than the first thermal resistance R1.

In contrast with a mixed light source in which all the semiconductor components are arranged on a common heat sink, different thermal resistances may have the effect of different temperatures being established in operation at the mounting points. The temperatures of the mounting points are preferably adapted to one another in such a way as to compensate different degrees of change to the emission, for instance the luminous flux, caused by different temperature coefficients.

The luminous flux Φ of a semiconductor component generated in operation decreases approximately linearly with a temperature coefficient K as the temperature increases.

The temperature of a mounting point $T_{BS}$ is typically a value ΔT above an ambient temperature $T_U$ when the semiconductor component is in operation. This temperature difference is calculated from the product of the thermal resistance R of the heat sink with the power loss P of the semiconductor component.

Thus, the relationship $T_{BS}=T_U+R*P$ applies for the temperature at the mounting point. In other words, the thermal resistance determines the temperature change ΔT relative to ambient temperature at a predetermined power loss.

The higher the thermal resistance of the heat sink, the higher is thus the temperature of the mounting point at a predetermined ambient temperature and a predetermined power loss of the semiconductor component.

In one preferred configuration the first radiation fraction has a luminous flux Φ1 when in operation, which changes as a function of the temperature of the first mounting point with a first temperature coefficient K1. The second radiation fraction has a luminous flux Φ2 when in operation, which changes as a function of the temperature of the second mounting point with a second temperature coefficient K2. Preferably, K1>K2 and R1<R2. In other words, the semiconductor component with the higher temperature coefficient is arranged on the heat sink with the lower thermal resistance.

In the case of a first power loss P1 generated when the first semiconductor component is in operation and a second power loss P2 generated by the second semiconductor component, the following relationship preferably applies:

$$(R1*P1)/(R2*P2)=A*K2/K1,$$

wherein A is an adaptation coefficient with 0.5≤A≤2.

For the ideal case of a coefficient of adaptation of A=1, the relationship ΔT1*K1=ΔT2*K2 thus applies. In this case the radiant power for the first semiconductor component and for the second semiconductor component thus falls equally sharply despite a different temperature coefficient. The dependency of the relationship between the first radiation fraction and the second radiation fraction and thus the color locus of the mixed light source is therefore eliminated for A=1 and very largely reduced for a value differing slightly from 1. Preferably, 0.8≤A≤1.2 applies.

In a preferred configuration, the first heat sink and second heat sink are decoupled thermally from one another. Thermally decoupled means in this context in particular that, when the mixed light source is in operation, largely mutually independent temperatures may be established for the first heat sink and the second heat sink. In particular, the power loss of the first semiconductor component has no or at least no significant influence on the temperature of the second heat sink and the power loss of the second semiconductor component has no or at least no significant influence on the temperature of the first heat sink. It is thus easier to ensure that, when the mixed light source is in operation, the first heat sink has a different temperature in the region of the first mounting point than the second heat sink in the region of the second mounting point. The first and second heat sinks may be connected robustly together mechanically, but it is expedient for them not to directly adjoin one another.

In a preferred further development, an insulation layer is formed at least in places between the first heat sink and the second heat sink. The insulation layer preferably adjoins the first heat sink and furthermore preferably the second heat sink. The insulation layer is preferably configured such that the first and second heat sinks do not adjoin one another directly at any point. The insulation layer is furthermore preferably made from a material which has a thermal conductivity which is at least 10 times lower than that of the first heat sink.

The insulation layer preferably has a thermal conductivity of at most 10 W/(m*K), particularly preferably of at most 1 W/(m*K).

In a further preferred configuration, the first and second heat sinks overlap when the mixed light source is viewed in plan view. Compared with heat sinks arranged next to one another, it is thus easier to achieve spatially uniform emission of the mixed light source with regard to color locus in the far field, in particular at a distance which is large compared with the spacing of the semiconductor components.

In a preferred configuration, the first semiconductor component and the second semiconductor component are based on different compound semiconductor material systems. With different compound semiconductor material systems it is possible in a simple manner to achieve radiation fractions in different spectral ranges. The compound semiconductor material systems are preferably III-V compound semiconductor material systems, which differ from one another in the group V element of the semiconductor lattice, which occupies the majority, i.e., more than 50%, of the group V lattice sites.

The first semiconductor component is preferably based on a phosphide compound semiconductor material.

In this context, "based on phosphide compound semiconductors" means that a semiconductor body of the semiconductor component, in particular an active region provided for generating radiation, preferably comprises $Al_nGa_mIn_{1-n-m}P$, wherein $0 \leq n \leq 1$, $0 \leq m \leq 1$ and $n+m \leq 1$, preferably with $n \neq 0$ and/or $m \neq 0$. This material need not necessarily have a mathematically exact composition according to the above formula. Instead, it may comprise one or more dopants and additional constituents which do not substantially modify the physical characteristics of the material. For simplicity's sake, however, the above formula includes only the fundamental constituents of the crystal lattice (Al, Ga, In, P), even if these may in part be replaced by small quantities of further substances.

The second semiconductor component is moreover preferably based on a nitride compound semiconductor material.

In the present context, "based on nitride compound semiconductors" means that a semiconductor body of the semiconductor component, in particular an active region provided for generating radiation, comprises a nitride III-V compound semiconductor material, preferably $Al_nGa_mIn_{1-n-m}N$, wherein $0 \leq n \leq 1$, $0 \leq m \leq 1$ and $n+m \leq 1$. This material need not necessarily have a mathematically exact composition according to the above formula. Instead, it may comprise one or more dopants and additional constituents which do not substantially modify the characteristic physical properties of the $Al_nGa_mIn_{1-n-m}N$ material. For simplicity's sake, however, the above formula includes only the fundamental constituents of the crystal lattice (Al, Ga, In, N), even if these may in part be replaced by small quantities of further substances.

The different temperature coefficients in these semiconductor material systems may be compensated by different thermal resistances for the heat sinks.

In one variant configuration the first heat sink differs from the second heat sink in its geometric shape. The geometric shape here in particular includes the size of the heat sink.

Alternatively or in addition, the first heat sink may comprise a different emissivity from the second heat sink. To increase emissivity, a coating may for example be provided on the heat sink.

In an alternative configuration, the first heat sink is an active heat sink and the second heat sink is a passive heat sink. The active heat sink may, for example, be cooled via a cooling medium or via a fan.

In a further variant configuration, the first heat sink and second heat sink differ from one another with regard to the materials used.

In a further preferred configuration, the first heat sink has a first thermal capacity C1 and the second heat sink has a second thermal capacity C2, wherein the following relationship applies:

$R1*C1/(R2*C2)=B,$ wherein for the coefficient B $0.5 \leq B \leq 2$ applies, preferably $0.8 \leq B \leq 1.2$. The closer coefficient B is to the ideal value of 1, the more precisely stabilized is the transient behavior of the mixed light source, i.e., the behavior of the mixed light source during a change in temperature.

In a preferred configuration, a plurality of first semiconductor components are arranged on the first heat sink and a plurality of second semiconductor components are arranged on the second heat sink.

Between the at least one first semiconductor component and the first heat sink and/or between the at least one second semiconductor component and the second heat sink, an intermediate carrier is preferably arranged, for example, a circuit board, for instance a printed circuit board (PCB) or a metal core printed circuit board (MCPCB) or a ceramic carrier with electrical connecting leads for the semiconductor components.

BRIEF DESCRIPTION OF THE DRAWINGS

Further features, configurations and convenient aspects are revealed by the following description of the exemplary embodiments in conjunction with the figures.

Identical, similar or identically acting elements are provided with the same reference numerals in the figures. The figures and size ratios of the elements illustrated in the figures relative to one another are not to be regarded as being to scale. Rather, individual elements may be illustrated on an exaggeratedly large scale for greater ease of depiction and/or better comprehension.

In the drawings:

FIG. 1 is a schematic sectional view of a first exemplary embodiment of a mixed light source;

FIG. 2 is a schematic sectional view of a second exemplary embodiment of a mixed light source;

FIG. 3 is a perspective schematic representation of a third exemplary embodiment of a mixed light source; and FIG. 4 shows simulation results for the luminous flux Φ and the temperature change ΔT as a function of the time t during the switch-on process of a mixed light source, in each case in comparison with a conventional mixed light source.

DETAILED DESCRIPTION OF ILLUSTRATIVE EMBODIMENTS

Figure 1:
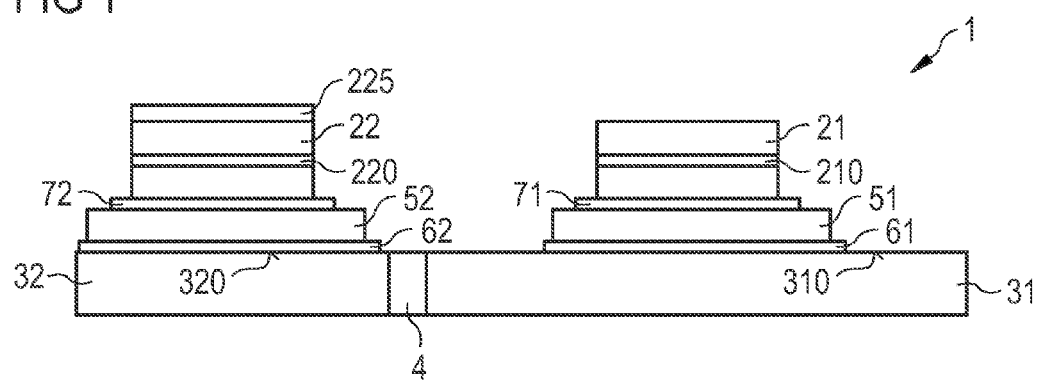

A mixed light source 1 according to the first exemplary embodiment illustrated in FIG. 1 comprises a first heat sink 31 with a first major face 310. At the first major face, a first semiconductor component 21 with an active region 210 provided for generating radiation is arranged on the first heat sink. When the mixed light source is in operation, the active region 210 is provided for generating a first radiation fraction. The first semiconductor component is mounted on a first intermediate carrier 51 by means of a mounting layer 71, for example, a solder or an electrically conductive adhesive layer. The intermediate carrier may, for example, take the form of a circuit board, for instance a PCB or a metal core printed circuit board. A ceramic carrier with electrical connecting leads may also be used.

The first semiconductor component 21 with the intermediate carrier 51 is mounted on the first heat sink 31 by means of a first mounting point 61. The first mounting point directly adjoins the first heat sink. The first mounting point may, for example, be formed by a solder layer or an electrically conductive adhesive layer.

The active region 210 may, for example, be based on a phosphide compound semiconductor material. With this semiconductor material, radiation in the yellow or red spectral range may be particularly efficiently generated. The first semiconductor component 21 may be provided, for example, for generating radiation in the red spectral range, in particular for generating radiation with a peak wavelength of between 600 nm and 660 nm inclusive.

The mixed light source 1 further comprises a second heat sink 32 with a second major face 320. As described in relation to the first semiconductor component 21, a second semiconductor component 22 with an active region 220 provided for generating radiation of a second radiation fraction is arranged on the second heat sink 32. The second semiconductor component 22 is joined to a second intermediate carrier 52 via a second mounting layer 72. The second semiconductor component with the second intermediate carrier is joined by means of a second mounting point 62 to the second heat sink 32.

The intermediate carriers 51, 52 may be the same or different with regard to the material used.

The second semiconductor component 22 is based on a compound semiconductor material system different from the first semiconductor component. The second semiconductor component 22, in particular the active region 220 may, for example, be based on a nitride compound semiconductor material. Nitride compound semiconductor material is suitable in particular for generating radiation in the blue and ultraviolet spectral range. The second semiconductor component 22 may itself be provided for generating mixed radiation. For example, a conversion element 225 may be formed on the second semiconductor component 22, which conversion element 224 at least partially absorbs primary radiation generated in the active region 220 and converts it into secondary radiation.

The second radiation fraction, comprising the primary radiation and secondary radiation and generated overall by the second semiconductor component 22 may, for example, have a value for $C_x$ in the CIE diagram of between 0.2 and 0.45 inclusive and for $C_y$ of between 0.1 and 0.61 inclusive.

Together with the first radiation fraction 21, the mixed light source may thus emit radiation with a high color rendering index which appears white to the human eye.

In this exemplary embodiment the first heat sink 31 and the second heat sink 32 are decoupled thermally from one another by means of an insulation layer 4.

A material particularly suitable for the insulation layer 4 is one whose thermal conductivity is lower by at least a factor of 10 than the thermal conductivity of the first heat sink 31. A particularly suitable material has a thermal conductivity of at most 1 W/(m*K). The insulation layer 4 may for example contain a plastics material or consist of a plastics material.

The first heat sink 31 has a first thermal resistance R1, which is lower than the thermal resistance R2 of the second heat sink 32. The thermal resistance determines the temperature difference ΔT between the ambient temperature and the temperature at the mounting points 61, 62. In this way, different temperatures can be established at the mounting points 61, 62.

In the exemplary embodiment shown, a lower thermal resistance is achieved for the first heat sink 31 than for the second heat sink 32 by making the first heat sink larger. Alternatively or in addition, active cooling may be provided for the first heat sink 31, for example, by means of a fan, a heat pipe or a thermal base or by means of water cooling, while the second heat sink 32 takes the form of a passive heat sink.

With a predetermined power loss P1 and a temperature coefficient K1 for the first semiconductor component and a predetermined power loss P2 and a temperature coefficient K2 for the second semiconductor component, the thermal resistances R1 and R2 are such that the relationship $$(R1*P1)/(R2*P2)=A*K2/K1$$

applies, wherein A is a coefficient of adaptation with $0.5 \leq A \leq 2$.

For the ideal value of A=1, the thermal resistances R1 and R2 are adapted to the semiconductor components 21, 22 in such a way that, in the event of an increase in temperature, the loss of brightness for the first semiconductor component 21 is the same as the loss of brightness for the second semiconductor component 22. Even in the event of a fall in brightness with increasing temperature, the ratio of the first radiation fraction to the second radiation fraction thus remains constant, such that the color locus of the radiation emitted overall by the mixed light source does not change or at least does not change significantly. The following relationship preferably applies for the adaptation factor A: $0.8 \leq A \leq 1.2$.

The figure shows just one first semiconductor component 21 and one second semiconductor component 22, merely to simplify representation. To increase the radiant power emitted overall by the mixed light source 1, said mixed light source may also comprise a plurality of first semiconductor components and a plurality of second semiconductor components, wherein the first heat sink 31 is conveniently free of second semiconductor components 22 and the second heat sink 32 is free of first semiconductor components 21. Furthermore, the mixed light source may also comprise more than two heat sinks, for example, three heat sinks.

The heat sinks 31, 32 may each contain a metal, for example, copper, aluminum, molybdenum or tungsten or an alloy with one of the stated materials or consist of such a material. The thermal conductivity of the material for the heat sink amounts preferably to at least 40 W/(m*K), particularly preferably to at least 100 W/(m*K). A ceramic may also be used for the heat sinks 31, 32.

In the exemplary embodiment, a mixed light source configured as a white light source, with a first semiconductor component based on a phosphide compound semiconductor material and a second semiconductor component based on a nitride compound semiconductor material, was shown merely by way of example. The arrangement of separate, in particular thermally decoupled, heat sinks is however suitable in principle for mixed light sources with at least two different types of semiconductor components, which have different degrees of temperature dependency. The semiconductor component with greater temperature dependency is conveniently mounted on the heat sink at which the lower temperature is established at the mounting point when in operation.

To stabilize the color locus of the mixed light source even during a color change, for example, on a change in the ambient temperature or during the process of switching on the mixed light source, the thermal RC constants, i.e., the product of thermal resistance and thermal capacity of the heat sinks, may preferably also be adapted to one another. The following relationship preferably applies:

$$R1*C1/(R2*C2)=B \text{ with } 0.5 \leq B \leq 2.$$

The closer is the coefficient B to the ideal value of 1, the better the thermal RC constants of the heat sinks 31, 32 are adapted to one another. Preferably, $0.8 \leq B \leq 1.2$ applies.

Simulation results for the luminous flux Φ and the temperature change ΔT as a function of the temperature t during the process of switching on the mixed light source are shown in FIG. 4. Temperature coefficients of K1=0.006 $K^{-1}$ and K2=0.0026 $K^{-1}$ form the basis of the simulation calculations.

R1/R2=1/3 applies for the ratio of the thermal resistances. C1/C2=9/3 applies for the thermal capacities. The first heat sink and second heat sink are thus identical with regard to their thermal RC constant.

In FIG. 4 a curve 81 shows the temperature increase ΔT1 at the first mounting point 61. A curve 82 shows a temperature increase ΔT2 at the second mounting point 62.

In comparison thereto, reference numeral 91 shows simulation results for a temperature increase in the case of a mixed light source in which the first semiconductor component 21 and the second semiconductor component 22 are arranged on a common heat sink.

A curve 85 shows the luminous flux Φ of the first semiconductor component 21, and a curve 86 the luminous flux Φ of the second semiconductor component 22. In comparison thereto, the curves 95 and 96 each show the luminous flux respectively for a first and second semiconductor component in the case of an arrangement on a common heat sink.

The luminous flux Φ is normalized for all the curves in each case to the luminous flux directly after switch-on.

As curves 81, 82 show, different temperatures are established for the mounting points 61, 62. In this way, the different high temperature coefficients of the semiconductor components 21, 22 are compensated, such that the luminous flux Φ, as curves 85, 86 show, differ only slightly from one another for the two radiation fractions of the semiconductor components 21, 22 over the entire time profile. Consequently, the color locus of the mixed light source changes only slightly over the time t. A comparatively complex control system for driving the semiconductor components can be dispensed with.

With a conventional mixed light source with a common heat sink, the luminous flux for t>60 s falls for the second radiation fraction (curve 96) by approximately 17% and for the first radiation fraction by approximately 38% (curve 95), such that the color locus of the mixed light source changes comparatively significantly.

Figure 2:
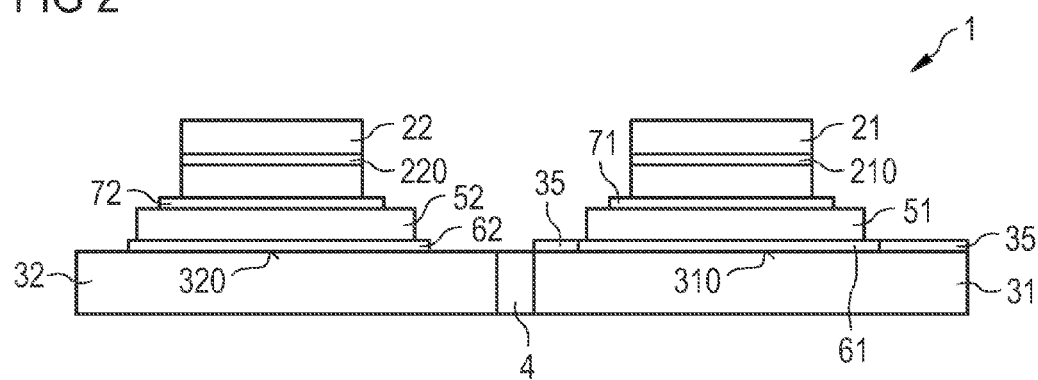

A second exemplary embodiment for a mixed light source is illustrated in schematic sectional view in FIG. 2. This second exemplary embodiment substantially corresponds to the first exemplary embodiment described in connection with FIG. 1. Unlike in FIG. 1, a coating 35 is provided on the first heat sink 31. The purpose of the coating 35 is to increase the emissivity of the first heat sink and thus to reduce the temperature at the first mounting point 61. The coating preferably has an emissivity of at least 0.8, particularly preferably of at least 0.9.

In comparison thereto, the emissivity of a polished metal typically has a value of approximately 0.3 and the emissivity of a rough metal an emissivity of 0.5 to 0.6. Even with the same size and the same material for the heat sinks 31, 32, the thermal resistance of the first heat sink may thus be greatly reduced in comparison with the second heat sink by applying the coating, for example, by a factor of between 1.5 and 3 inclusive.

It goes without saying that different measures for forming heat sinks with different thermal resistances may also be combined together, for example, heat sinks of different sizes, the surfaces of which are provided to differing extents with a coating.

A third exemplary embodiment of a mixed light source is shown schematically in perspective representation in FIG. 3. This third exemplary embodiment substantially corresponds to the first exemplary embodiment described in connection with FIG. 1.

In this exemplary embodiment, the first heat sink 31 and the second heat sink 32 are configured such that they overlap when viewed in plan view onto the mixed light source, i.e., in a view onto the first major face 310 of the first heat sink 31. The first heat sink 31 has a bottom part 31A and a top part 31B joined to the bottom part. The first heat sink may in particular be configured with the bottom part and the top part in one piece.

The top part 31B has a smaller cross-section than the bottom part 31A when viewed in plan view. In the exemplary embodiment shown, the bottom part and the top part are each configured with a cylindrical basic shape, the axes of the cylinders extending in collinear manner. The second heat sink 32 is annular in shape and runs around the top part 31B of the first heat sink 31 in the lateral direction. An insulation layer 4 is formed continuously between the first heat sink 31 and the second heat sink 32, such that the heat sinks 31, 32 do not adjoin one another directly at any point. The heat sinks 31, 32 are decoupled from one another by means of the insulation layer, and hence thermally, and moreover are joined together mechanically by way of the insulation layer.

It goes without saying that the bottom part 31A and the top part 31B of the first heat sink 31 may also have a shape deviating from a cylindrical basic shape, for example, a polygonal, in particular rectangular, basic shape. Furthermore, the first heat sink 31 may also be configured such that the top part 31B runs around the second heat sink 32 in places, i.e., the top part 31B may run around annularly the second heat sink 32 of, for example, a cylindrical construction.

The described arrangement of different types of semiconductor components on respectively associated heat sinks, which overlap in plan view onto the major face of the heat sink, makes it simpler to produce a mixed light source in which two separate heat sinks are arranged compactly and mutually thermally decoupled in such a way that the radiant power emitted by the first semiconductor components 21 and the second semiconductor components 22 has high color homogeneity in the lateral direction.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A mixed light source comprising:
   a first semiconductor component that is provided for generating a first radiation fraction; and
   a second semiconductor component that is provided for generating radiation of a second radiation fraction different from the first radiation fraction;
   wherein the first semiconductor component is mounted by a first mounting point on a first heat sink with a first thermal resistance $R1$;
   wherein the second semiconductor component is mounted by means of a second mounting point on a second heat sink with a second thermal resistance $R2$;
   wherein the thermal resistances $R1$ and $R2$ are different from one another; and
   wherein the first heat sink has a first thermal capacity $C1$ and the second heat sink a second thermal capacity $C2$ and the following relationship applies:

$$R1*C1/(R2*C2)=B,$$

wherein $0.5 \leq B \leq 2$.

2. The mixed light source according to claim 1,
wherein the first radiation fraction has a luminous flux Φ1 when in operation, which changes as a function of the temperature of the first mounting point with a first temperature coefficient K1;
wherein the second radiation fraction has a luminous flux Φ2 when in operation, which changes as a function of the temperature of the second mounting point with a second temperature coefficient K2;
wherein K1 is greater than K2; and
wherein R1 is less than R2.

3. The mixed light source according to claim 2,
wherein, when in operation, the first semiconductor component generates a first power loss P1 and the second semiconductor component a second power loss P2 and the following relationship applies:

$$(R1*P1)/(R2*P2)=A*K2/K1,$$

wherein A is a coefficient of adaptation with $0.5 \leq A \leq 2$.

4. The mixed light source according to claim 3, wherein $0.8 \leq A \leq 1.2$.

5. The mixed light source according to claim 1, wherein the first heat sink and the second heat sink are thermally decoupled from one another.

6. The mixed light source according to claim 1, further comprising an insulation layer formed in places between the first heat sink and the second heat sink the insulation layer adjoining the first heat sink and the second heat sink.

7. The mixed light source according to claim 6, wherein the insulation layer is made from a material that has a thermal conductivity that is at least ten times lower than that of the first heat sink.

8. The mixed light source according to claim 1, wherein the first heat sink and second heat sink overlap in plan view onto the mixed light source.

9. The mixed light source according to claim 1, wherein the first semiconductor component and the second semiconductor component are based on different compound semiconductor material systems.

10. The mixed light source according to claim 1, wherein the first heat sink differs from the second heat sink in geometric shape.

11. The mixed light source according to claim 1, wherein the first heat sink has an emissivity different from the second heat sink.

12. The mixed light source according to claim 1, wherein the first heat sink is an active heat sink and the second heat sink is a passive heat sink.

13. The mixed light source according to claim 1, wherein the first heat sink and second heat sink are different from one another with regard to materials.

14. The mixed light source according to claim 1, wherein $0.8 \leq B \leq 1.2$ applies.

15. The mixed light source according to claim 1, wherein the first heat sink has a bottom part and a top part joined to the bottom part and the second heat sink runs around the top part of the first heat sink in a lateral direction.

16. A mixed light source comprising:
a first semiconductor component, which is provided for generating a first radiation fraction; and
a second semiconductor component, which is provided for generating radiation of a second radiation fraction different from the first radiation fraction;
wherein the first semiconductor component is mounted by a first mounting point on a first heat sink with a first thermal resistance R1;
wherein the second semiconductor component is mounted by a second mounting point on a second heat sink with a second thermal resistance R2;
wherein the thermal resistances R1 and R2 are different from one another;
wherein the first heat sink comprises a bottom part and a top part connected to the bottom part;
wherein the second heat sink runs around the top part or the top part runs around the second heat sink; and
wherein the first heat sink and the second heat sink overlap without directly adjoining one another at any point and when viewed in plan view of the mixed light source.

17. The mixed light source according to claim 16, wherein the first heat sink is configured with the bottom part and the top part in one piece.

18. The mixed light source according to claim 16, wherein the second heat sink runs around the top part along an entire circumference of the top part or the top part runs around the second heat sink along an entire circumference of the second heat sink.

* * * * *